United States Patent
Lee et al.

(10) Patent No.: US 8,111,799 B2
(45) Date of Patent: Feb. 7, 2012

(54) METHOD, SYSTEM AND APPARATUS FOR REDUCING POWER CONSUMPTION AT LOW TO MIDRANGE RESOLUTION SETTINGS

(75) Inventors: Jae-Ik Lee, San Jose, CA (US); Joe Edgar Goodart, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1039 days.

(21) Appl. No.: 11/968,650

(22) Filed: Jan. 3, 2008

(65) Prior Publication Data

US 2009/0175397 A1    Jul. 9, 2009

(51) Int. Cl.
*H03D 3/24* (2006.01)
*H04L 27/00* (2006.01)

(52) U.S. Cl. ........................... 375/376; 375/259

(58) Field of Classification Search .................. 375/354, 375/371–376, 355, 256, 257, 259, 219, 316
See application file for complete search history.

(56) References Cited

U.S. PATENT DOCUMENTS

| | | | | |
|---|---|---|---|---|
| 5,410,711 A | * | 4/1995 | Stewart | 713/323 |
| 5,974,464 A | * | 10/1999 | Shin et al. | 709/231 |
| 7,036,032 B2 | * | 4/2006 | Mizuyabu et al. | 713/323 |
| 2002/0039153 A1 | * | 4/2002 | Yoo | 348/730 |
| 2007/0190857 A1 | | 8/2007 | Galang et al. | |
| 2009/0175397 A1 | * | 7/2009 | Lee et al. | 375/376 |

* cited by examiner

*Primary Examiner* — Tesfaldet Bocure
(74) *Attorney, Agent, or Firm* — Garrana Tran LLP; Andrea E. Tran

(57) ABSTRACT

A method for reducing power consumption in an information handling system (IHS) where the method includes receiving main data through a main link, wherein the main link provides at least one data lane. The IHS also receives a reference clock corresponding to the main data through an auxiliary channel and provides the reference clock to a first phase-lock loop, wherein the first phase-lock loop outputs a stream clock.

20 Claims, 6 Drawing Sheets

| | DP Rx | | | | | |
|---|---|---|---|---|---|---|
| | Analog Block | | | | Digital Block | |
| | Equalizer x 2 Gain, 6db boost (mW) | PLL+Crystal (mW) | CDR (mW) | SerDes (mW) | Logic Power (mW) | Total DP Rx Power (mW) |
| Normal mode at 2 lanes | 150 | 80 | 120 | 200 | 200 | 750 |
| Low power mode at 2 lanes | 0 | 0 | 50 | 200 | 200 | 450 |
| Smart low power mode at 2 lanes | Disable | 0 | 50 | 100 | 0 | 150 |

FIG. 6

METHOD, SYSTEM AND APPARATUS FOR REDUCING POWER CONSUMPTION AT LOW TO MIDRANGE RESOLUTION SETTINGS

BACKGROUND

1. Technical Field

The present disclosure relates generally to the field of information handling systems. More specifically, but without limitation, the present disclosure relates to power consumption by display devices.

2. Background Information

As the value and use of information continues to increase, individuals and businesses seek additional ways to process and store information. One option available to users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for such systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In an information handling system (IHS), a display may often be present. The Video Electronics Standards Association (VESA) has proposed the use of a new DisplayPort standard. DisplayPort is a digital display interface standard that reduces device complexity and provides performance scalability. The DisplayPort standard may be used for both internal interfaces (e.g., interfaces within a PC or monitor) and external interfaces (e.g., interfaces from one device to another such as from a PC to a monitor or from a DVD player to a TV), at various resolution settings. However, the two link symbol clock speeds for DisplayPort may be quite high for midrange resolution support causing an unnecessary power drain when DisplayPort is used for low and midrange resolutions. In an IHS such as a portable device, available power may be limited by a battery pack or the like and therefore, power consumption may be a major concern.

Low voltage differential signaling (LVDS) transmits two different voltages that are compared at the receiver. LVDS can run at very high speeds over low cost, twisted-pair cables. In order to support extended graphics array (XGA) resolution, an LVDS receiver may consume less than 100 mW. However, a DisplayPort receiver may consume as much as 600-750 mW. The difference in power consumption between the DisplayPort standard and other standards may preclude the adoption of the DisplayPort standard in portable devices.

Thus a need remains for systems, apparatus, and methods for reducing power consumption in IHSs utilizing midrange or low resolution settings by current standards.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

One aspect of the disclosure provides a method for reducing power consumption in an information handling system (IHS) including receiving main data through a main link, wherein the main link provides at least one data lane, receiving a reference clock corresponding to the main data through an auxiliary channel and providing the reference clock to a first phase-lock loop, wherein the first phase-lock loop outputs a stream clock.

Another aspect of the disclosure provides an apparatus for reducing power consumption in an IHS including a receiver with a main link receiving main data, wherein the main link provides at least one data lane, an auxiliary channel receiving a reference clock, and a first phase-lock loop, wherein the reference clock is provided to the first phase-lock loop, and the first phase-lock loop outputs a stream clock.

Another illustrative aspect of the disclosure provides an IHS which may include a DisplayPort transmitter with a main output transmitting main data, and an auxiliary output transmitting a reference clock. The IHS also includes a DisplayPort receiver with a main input receiving main data, wherein the main input provides at least one data lane, an auxiliary input receiving the reference clock, and a first phase-lock loop, wherein the reference clock is provided to the first phase-lock loop, and the first phase-lock loop outputs a stream clock.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein:

FIG. 6 provides an illustrative table of estimated power consumption associated with a DisplayPort receiver.

DETAILED DESCRIPTION

Figure 1:
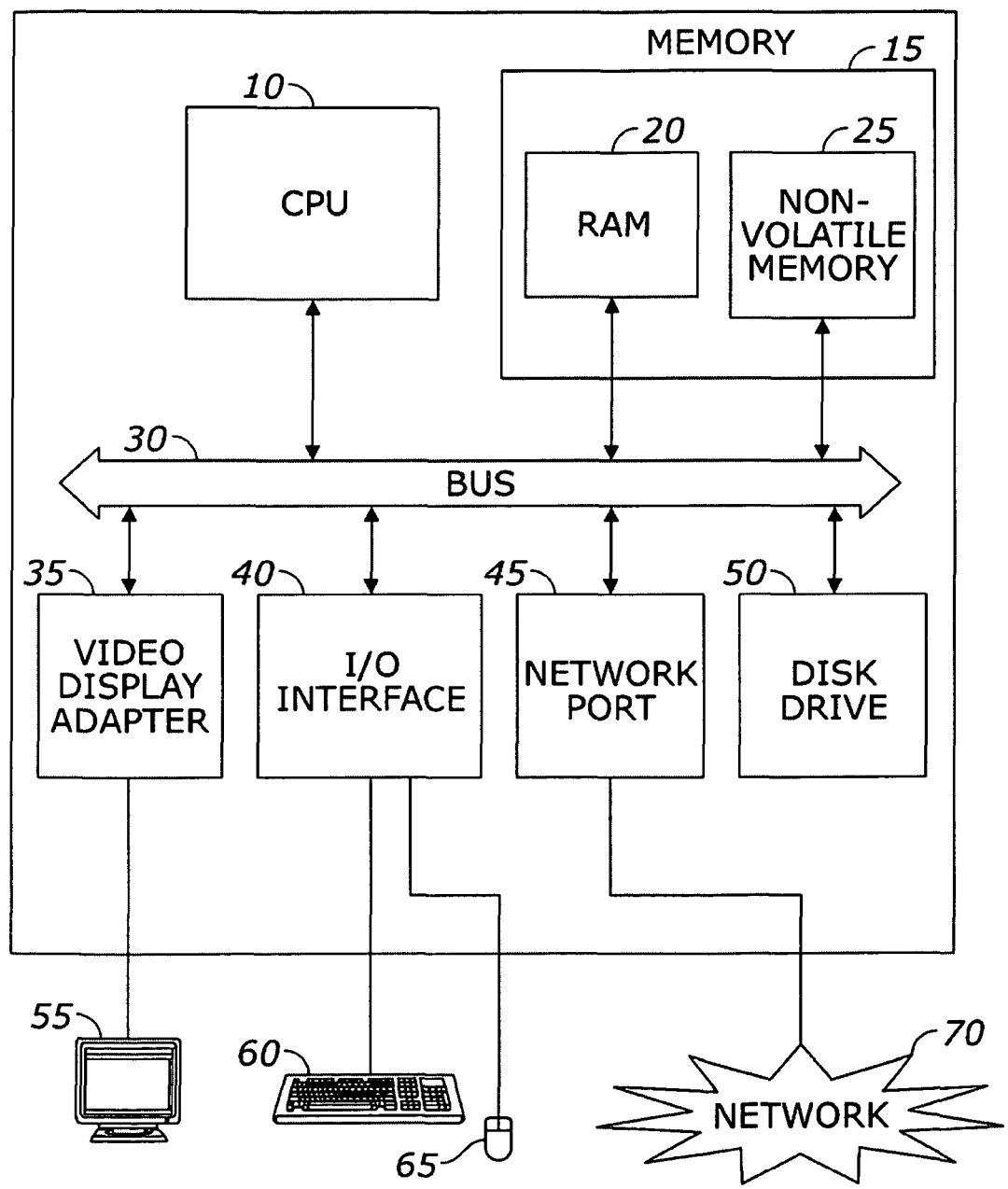
FIG. 1 provides an illustrative schematic of an information handling system according to the present disclosure.

Although the invention may be described with reference to specific implementations, it will be understood by those skilled in the art that various changes may be made without departing from the spirit or scope of the invention. Various examples of such changes have been given in the forgoing description. Accordingly, the disclosure of particular implementations is intended to be illustrative of the scope of the invention and is not intended to be limiting. It is intended that the scope of the invention shall be limited only to the extent required by the appended claims. For example, to one of ordinary skill in the art, it will be readily apparent that the information handling system discussed herein may be implemented in a variety of implementations, and that the forgoing discussion of certain of these implementations does not necessarily represent a complete description of all possible implementations. For simplicity and clarity of illustration, the drawing and/or figures illustrate the general manner of construction, and descriptions and details of well known features and techniques may be omitted to avoid unnecessarily obscuring the disclosure.

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

FIG. 1 illustrates one possible implementation of an IHS 5 comprising a CPU 10. It should be understood that the present disclosure has applicability to information handling systems as broadly described above, and is not intended to be limited to the IHS 5 as specifically described. The CPU 10 may comprise a processor, a microprocessor, minicomputer, or any other suitable device, including combinations and/or a plurality thereof, for executing programmed instructions. The CPU 10 may be in data communication over a local interface bus 30 with components including memory 15 and input/output interfaces 40. The memory 15, as illustrated, may include non-volatile memory 25. The non-volatile memory 25 may include, but is not limited to, firmware flash memory and electrically erasable programmable read-only memory (EEPROM). The firmware program (not shown) may contain, programming and/or executable instructions required to control a keyboard 60, mouse 65, video display 55 and/or other input/output devices not shown here. The memory may also comprise RAM 20. The operating system and application programs may be loaded into the RAM 20 for execution.

The IHS 5 may be implemented with a network port 45 to permit communication over a network 70 such as a local area network (LAN) or a wide area network (WAN), such as the Internet. As understood by those skilled in the art, IHS 5 implementations may also include an assortment of ports and interfaces for different peripherals and components, such as video display adapters 35, disk drives port 50, and input/output interfaces 40 (e.g., keyboard 60, mouse 65).

Figure 2:
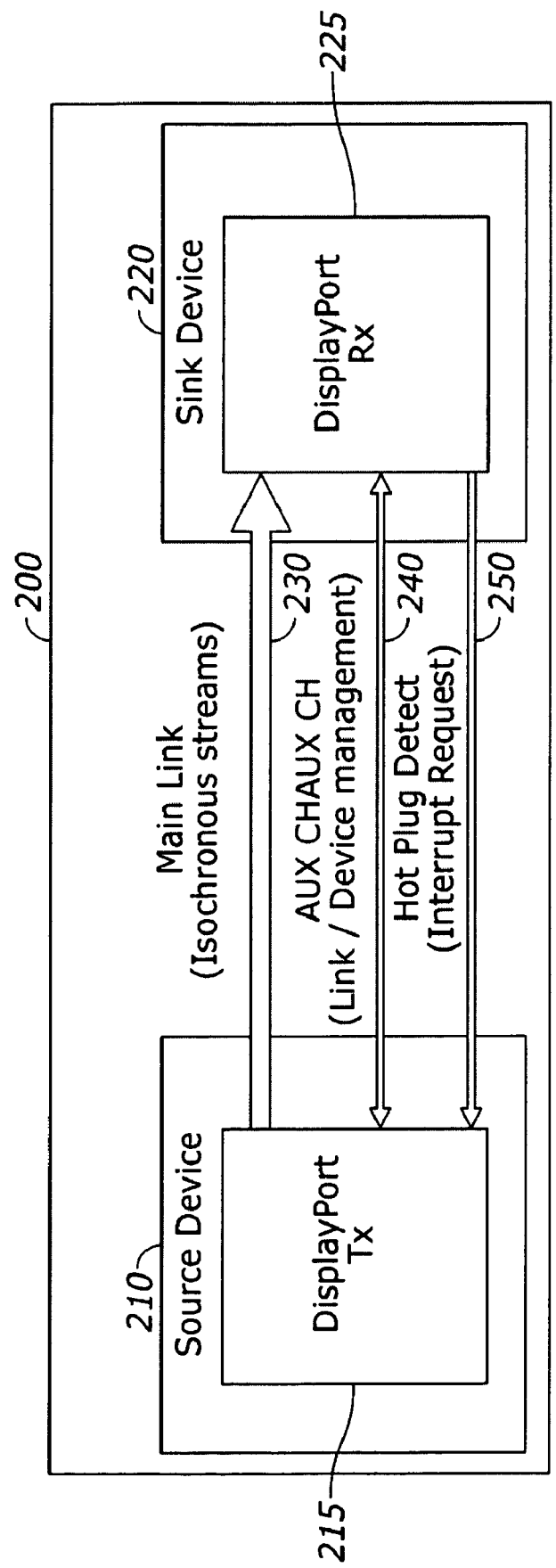
FIG. 2 provides a general overview of a DisplayPort link.

FIG. 2 provides a general overview of a DisplayPort link 200 utilizing a DisplayPort standard. The DisplayPort Standard Version 1.1 is herein incorporated by reference. In a DisplayPort link 200, there may be a source device 210 that may send data to a sink device 220. A source device 210, such as a computer, DVD player or the like, provides data whereas a sink device 220, such as a monitor, TV or the like, receives data. The source 210 and sink devices 220 may be coupled via a main link 230, an auxiliary channel (AUX CH) 240, and/or a hot-plug detect (HPD) signal line 250. A transmitter (Tx) 215 in the source device may send isochronous data streams through the main link 230 to a receiver (Rx) 225. The data streams may contain video data, audio data, control or management data, and the like. The main link 230 may be a unidirectional, high-bandwidth and low-latency channel. Currently, a DisplayPort link may support link speeds or rates of 2.7 Gbps and 1.62 Gbps per lane according to the DisplayPort Standard Version 1.1. The AUX CH 240 may be a half-duplexed bidirectional channel that may be used to send link management and device control data. The HPD signal line 250 may allow the source device 210 to detect a coupling to a sink device 220. The HPD also may allow an Rx 225 in the sink device to send an interrupt request (IRQ) to the source device.

After a hot-plug detect (HPD), the AUX CH 240 may be used for link training and high-bandwidth digital content protection (HDCP). The link training allows the source device to configure the link according to the Tx and Rx capabilities. Additionally, the AUX CH 240 may be used to send management and control data, such as extended display identification data (EDID) and display port configuration data (DPCD). However, the AUX CH 240 may rarely be used after the boot-up sequence is complete in some cases.

For example, when a DisplayPort link is an internal link in an IHS, the components of the IHS are likely to be contained within a single housing. The components within the housing may be unlikely to change so the boot-up sequence can be simplified. For example, a display and a motherboard in a laptop may be unlikely to change allowing elimination of HDCP. Once the DPCD has been read, the AUX CH 240 may be used to send a low speed reference clock. While DisplayPort version 1.1 defines an auxiliary channel speed of 1 MHz, it is anticipated that subsequent versions of DisplayPort may change the auxiliary channel speed to more than 500 MHz. By sending a clock through an auxiliary channel instead of a main link, a device utilizing a DisplayPort link may run at a link speed less than a DisplayPort version 1.1 link speed of 1.62 Gbps. Subsequent versions of DisplayPort may be expected to increase link speeds and in another implementation, it would be desirable to run at a link speed less than specified by the subsequent version. In some situations, this desired link speed may be greater than the DisplayPort version 1.1 link speed of 1.62 Gbps (however, it is not required). For example, if a subsequent version of DisplayPort specifies a link speed of 10 Gbps, then the methods provided in the present disclosure may allow a device to run at link speeds less than 10 Gbps, but greater than 1.62 Gbps. Since link training has been performed and since HDCP, EDID, and DPCD data has already been sent, the AUX CH 240 may rarely be used afterwards. By sending a low speed reference clock through the AUX CH 240, the sink device drains less power than a DisplayPort link sending a clock through the main link 230.

A low speed reference clock may be sent through the AUX CH 240, thereby allowing a DisplayPort link to reduce power consumption for the entire link by slowing down the data rate to accommodate a proper video clock rate. This allows the DisplayPort link to act in a similar manner as a LVDS or HDMI type of link. Little to no bits may need to be added to a stream of data since a link clock may closely match a video clock and any necessary overhead.

Figure 3:
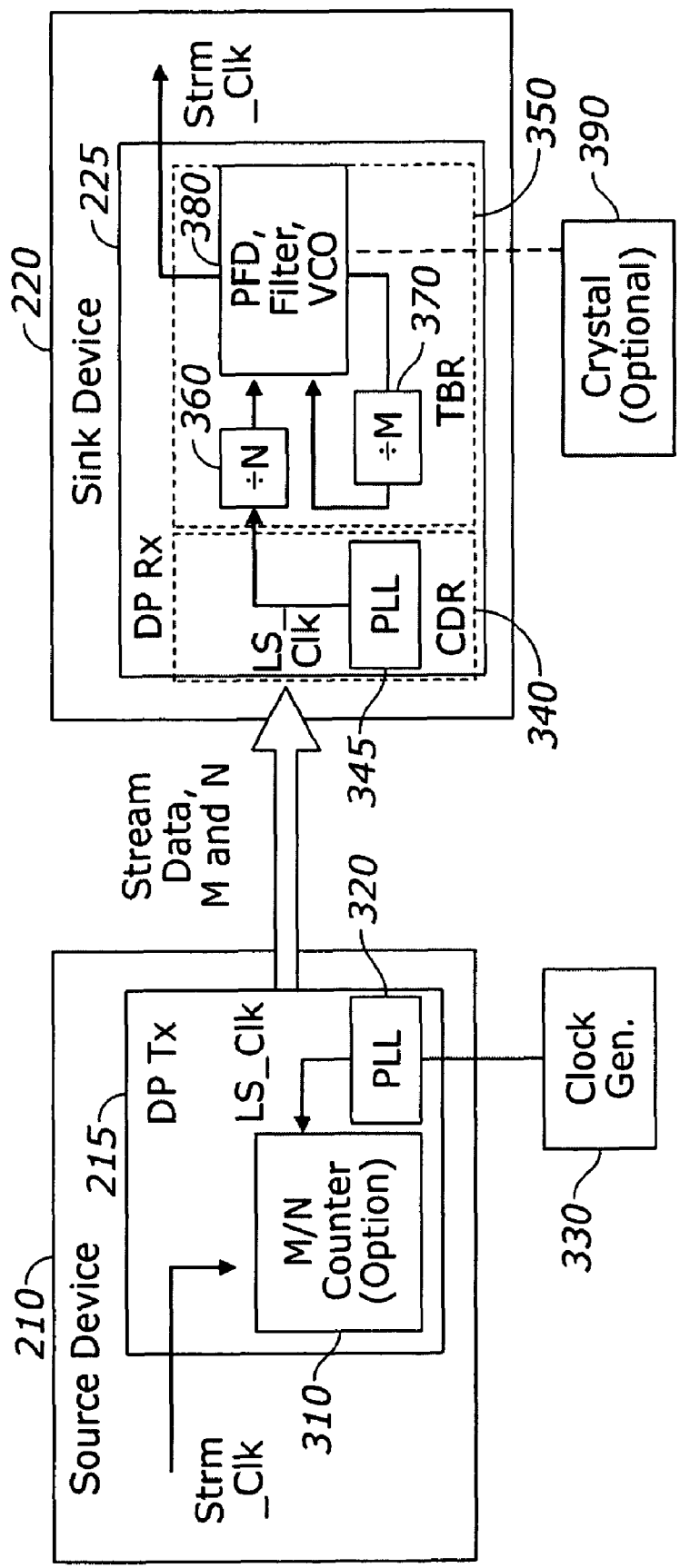
FIG. 3 represents an illustrative implementation of a DisplayPort transmitter and receiver.

FIG. 3 provides illustrative implementation of a DisplayPort transmitter and receiver. In a DisplayPort link, a source device 210 with a DisplayPort transmitter (DP Tx) 215 may send data to a sink device 220 with a DisplayPort receiver (DP Rx) 225. The DP Tx 215 may include a phase-locked loop (PLL) 320 and may optionally include a time stamp counter 310. It is well known in the art that a PLL may comprise a phase-frequency detector, a filter, a voltage controlled oscillator (VCO), as well as additional elements. The DP Tx 215 receives a stream clock (strm_clk) corresponding to the data to be transmitted. The DP Tx 215 may optionally have a time stamp counter 310 which generates time stamps that may be used to recover the stream clock. A signal from a clock generator 330 may be received by a PLL 320 to generate a link symbol clock (ls_clk).

A main link in a DisplayPort link may have one, two or four ac-coupled, doubly terminated differential pairs (or lanes). The main link may support link rates of 2.7 Gbps and 1.62 Gbps per lane. Since the link rate may be decoupled from the pixel rate, the pixel rate may be recovered from the link symbol clock using the time stamps M and N. Each lane may be capable of transporting eight bits of data per link symbol clock (ls_clk). Data to be sent through the main link may be packed and mapped. After packing and mapping, a packet stream data rate may be equal to or smaller than a link symbol rate. Bits may need to be added to a stream of data (i.e. stuffing data or bit stuffing) as needed to make the stream data rate equal to the link symbol data rate.

The DP Tx 215 sends stream data and time stamps M and N to the sink device 220. The DisplayPort receiver (DP Rx) 225 may have a clock-and-data recovery unit (CDR) 340 and a time base recovery unit (TBR) 350. The CDR 340 may contain a phase-locked loop (PLL) 345 that regenerates the ls_clk from the stream data and the time stamps received from the DP Tx 215. The ls_clk may be sent to time based recovery (TBR) 350 unit in order to recover the stream clock.

Figure 4:
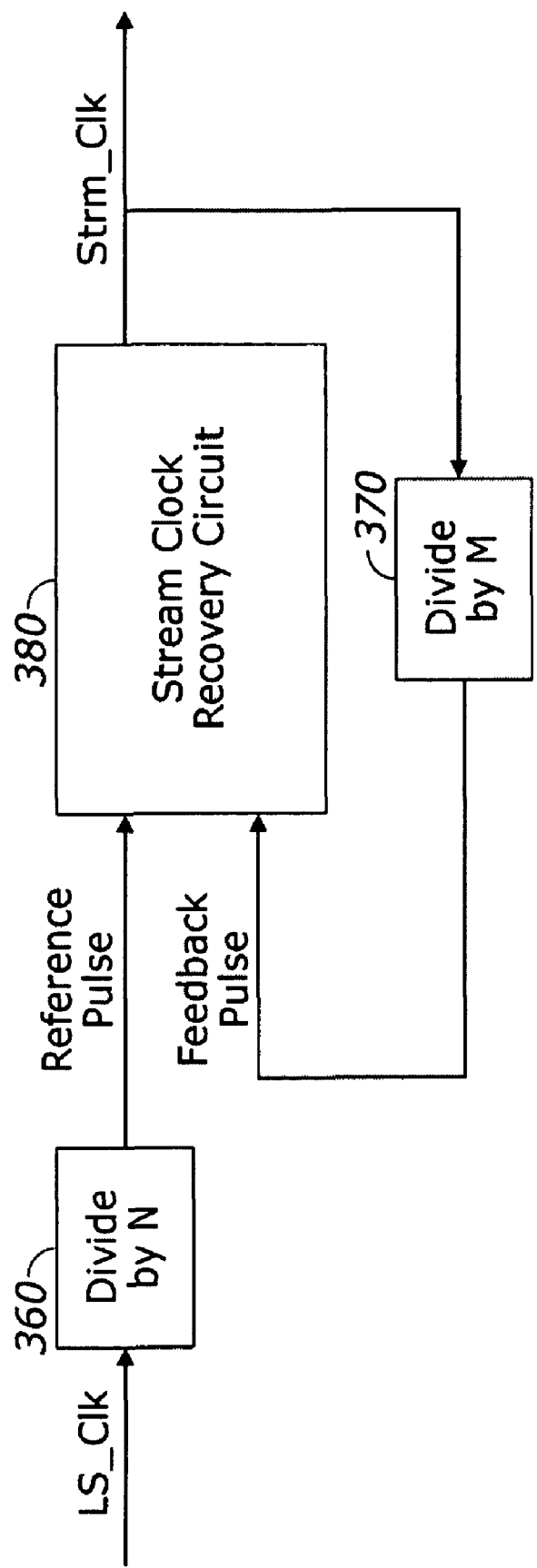
FIG. 4 provides an illustrative implementation of a stream clock recovery (SCR) circuit.

The TBR may use a stream clock recovery (SCR) circuit to recover the stream clock (strm_clk). FIG. 4 provides an illustrative implementation of a SCR circuit. In particular, the ls_clk may be fed into a first divider (N divider) 360 which divides the ls_clk and feeds the resulting reference signal to the SCR. A second divider (M divider) 370 divides the output signal of the SCR and sends a feedback signal to the SCR. The SCR 380 may contain phase-locked loop comprising a phase frequency detector (PFD), filter, voltage controlled oscillator (VCO), or any other known components common to phase lock loops. The SCR circuit may be used to recover the strm_clk from the ls_clk. Additionally, the TBR may optionally have a crystal oscillator 390 if greater precision is desired as shown in FIG. 3.

The stream clock (strm_clk) may be recovered using ls_clk and time stamps N and M. The following formulas may be used to calculate N and M:

$$N = \text{Reference pulse period}/ls\_clk \text{ period}$$

$$M = \text{Feedback pulse period}/strm\_clk \text{ period}$$

Since DisplayPort supports link rates of 2.7 Gbps and 1.62 Gbps per lane and the high clock speeds may cause the DP link to consume more energy than needed for midrange and low resolution support, some manufactures of portable devices may avoid using DisplayPort because battery life could be a major concern. In order to reduce the power consumed in a DisplayPort link at midrange and low resolutions, the auxiliary channel (AUX CH) may be used to send a low speed reference clock. When an AUX CH is used to provide a reference clock, the values of N and M will be much lower than in a typical DisplayPort link.

Figure 5:
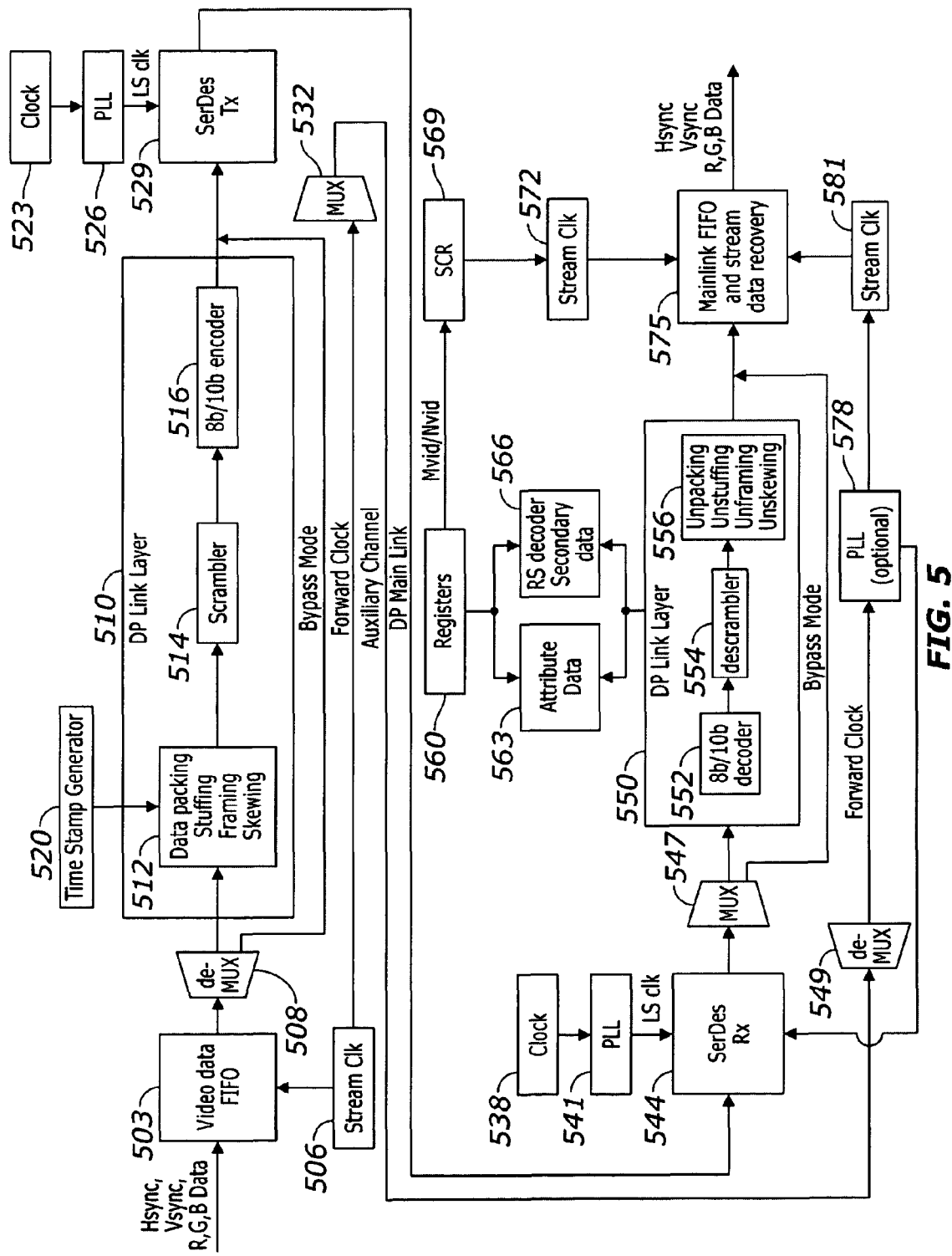
FIG. 5 represents another illustrative implementation of a DisplayPort link.

FIG. 5 provides yet another illustrative implementation of a DisplayPort link. An incoming video signal may provide horizontal sync (Hsync) data, vertical sync (Vsync) data, RGB data and/or additional data. In the DisplayPort standard, video data may be provided in a variety of formats. While the illustrations and descriptions provided may refer specifically to RGB data, the scope of the claims is not limited to RGB data, but rather any suitable video data format may be implemented. It is understood that the implementations discussed in the disclosure are also applicable to audio data as well as other types of data.

The DisplayPort link shown in FIG. 5 may have at least two modes of operation. The first mode of operation or a normal mode transmits at link rates of 2.7 Gbps and 1.62 Gbps per lane. A source device may be connected to a sink device by a main link, auxiliary channel, and/or a HPD, as discussed previously in reference to FIG. 2. In a source device, video data may be provided in a first-in-first-out (FIFO) 503 manner to a demultiplexer 508. In the normal mode, a demultiplexer 508 then provides data to a DisplayPort (DP) link layer 510 in accordance with a stream clock 506. However, in other modes of operation, a demultiplexer 508 may allow a DP link layer 510 to be bypassed. The DP link layer 510 may perform data packing, stuffing, framing, and skewing 512 on video data. A time stamp generator 520 may add time stamps M and N to video data. Additionally, video data may be sent to a scrambler 514 and an encoder 516. The encoder 516 may perform 8b/10b encoding and sends encoded data to a serializer/deserializer (SerDes) Tx 529. A clock 523 may provide a reference pulse to a PLL 526 in order to generate a link symbol clock (ls_clk). A SerDes Tx 529 may convert the video data from serial data to parallel data and transmit the data in accordance with the ls_clk.

The video data may be transmitted through a main link to a sink device. In a sink device, a PLL 541 may receive a reference pulse from a clock 538 and generate a ls_clk. A SerDes Rx 544 receives video data and may output video data in accordance with a ls_clk. A multiplexer 547 receives video data from a SerDes Rx 544 and forwards the signal to DP link layer 550. However, in other modes of operation, a multiplexer 547 may allow a DP link layer 550 to be bypassed. The DP link layer 550 may perform decoding and descrambling using an 8b/10b decoder 552 and a descrambler 554. Additionally, any unpacking, unstuffing, unframing, and unskewing 556 may be performed if needed. Attribute data and secondary data may be extracted from the video data. Attribute data may contain packet identification data, blanking information and the like. Decoded attribute data received from a DP link layer 550 may be used to update an attribute register configuration 563. Additionally, a register status may be repeatedly checked for proper operation. Secondary data may contain audio and/or control information, and secondary data may be decoded by a RS decoder 566. Attribute data and secondary data may be sent to registers 560. Time stamps M and N may be provided to a stream clock recovery (SCR) circuit 569 from the registers 560. A SCR circuit 569 may have a fractional PLL or similar type of PLL. A stream clock recovery circuit 569 may be used to convert from a link domain to a stream domain. A stream clock 572 may be recovered and provided to a mainlink FIFO and stream data recovery unit 575. A mainlink FIFO and stream data recovery unit 575 outputs the Hsync, Vsync, and RGB data in accordance with a stream clock 572. A DisplayPort link of the first mode of operation allows a signal to be sent from a source to a sink. However, as discussed previously, for a midrange to low resolution setting, the 2 link clock speeds utilized by the DisplayPort standard may be higher than needed and consume unnecessary power.

In a second mode of operation or a bypass mode, a reference clock may be sent through an AUX CH. The reference clock may operate at a lower speed than the DisplayPort link rates of 2.7 Gbps and 1.62 Gbps per lane. Video data may be received and processed in a simpler manner than the first mode of operation. A stream clock 506 generates a forward clock. A forward clock may be equivalent to a stream clock or it may be a lower multiple of a stream clock that is locked. The forward clock may be sent to a multiplexer 532. The multiplexer 532 may combine the forward clock and any control signals into one signal before the control signals and forward clock are transmitted. Video data from a FIFO 503 may bypass a DP link layer 510 using demultiplexer 508. Since a forward clock may be a low speed reference clock that closely matches a video clock, little to no data stuffing may be needed. A time stamp generator 520 may be powered down since timestamps are not used to recover the stream clock in the second mode of operation. Since a DP link layer 510 may be bypassed and a time stamp generator 520 may be powered down, power consumption may be reduced. In another implementation, some stuffing data may be needed so the DP link layer 510 may not be bypassed. However, some circuitry may still be powered down to reduce power consumption. Further, an IHS may allow for dynamically switching between modes. For example, an IHS may switch from a first mode of operation to a second mode of operation when the IHS switches from using a power outlet to using battery power. Additionally, an IHS may switch from a mode bypassing the DP link layer 510 to a mode utilizing the DP link layer 510.

A forward clock and control signals may be received and demultiplexed by a demultiplexer 549. A forward clock may be sent to an optional PLL 578. A SerDes Rx 544 may output data in accordance with a forward clock from an optional PLL 578. Since data is not output from a SerDes Rx 544 in accordance with a ls_clk, a clock 538 and PLL 541 may be powered down. A SerDes Rx 544 sends data to a MUX 557 which may bypass a DP link layer 550. In another implementation, stuffing data may still be needed so a DP link layer 550 may not be bypassed. However, some circuitry may still be able to be powered down to reduce power consumption. In some cases, the transmission of the forward clock may not significantly alter the phase and frequency of the signal. If the phase and frequency of a forward clock are not significantly altered during transmission, a PLL 578 may not be required. Additionally, an optional PLL 578 may be simpler than a fractional PLL or a stream clock recovery circuit. For example, an optional PLL 578 may not have divider M and divider N shown in FIG. 4.

Video data may be output according to a stream clock 581 which is locked to a forward clock. Since a forward clock closely matches a stream clock, a link symbol clock may not be transmitted through a main link and stream clock recovery may not be necessary. As a result, a stream clock recovery circuit 569 and a stream clock 572 may be powered down. As discussed previously, in some cases clock 538 and PLL 541 may also be powered down. Since much of the circuitry may be powered down, less power may be consumed in the second mode of operation. In the case that DP link layers 510 & 550 are bypassed and a clock 538, PLL 541, SCR 569, and stream clock 572 are powered down, power consumption may be reduced to levels close to current LVDS systems.

FIG. 6 provides an illustrative table of estimated power consumption in a DisplayPort receiver. The table provides estimated power consumption of several components in a DP Rx for three different modes with a XGA setting. A normal mode may represent a DP Rx using two data lanes. A low power mode may represent a low power mode set out in the DisplayPort standard using two data lanes. A smart low power mode may represent a mode in which a low speed reference clock is sent through an auxiliary channel and two data lanes are used as discussed in FIG. 5. In a DisplayPort Rx operating in a normal mode, an analog block and a digital block may be estimated to consume 750 mW. In a low power mode, the blocks may be estimated to consume 450 mW. In a smart low power mode, the blocks may be estimated to consume 150 mW. By sending a low speed reference clock through the auxiliary channel, power consumption may be reduced by as much as 80%. In an analog block of a DP Rx an equalizer, PLL, crystal oscillator, CDR unit and SerDes may consumer power. An equalizer may consume 150 mW in a normal mode, but the equalizer may be disabled in a low power mode and a smart low power mode. A PLL and crystal oscillator may consume 80 mW in a normal mode, but in a low power mode and a smart low power mode no power may be consumed. The CDR unit may consume 120 mW in a normal mode, but only 50 mW in a low power mode and smart low power mode. The SerDes may consume 200 mW in a normal mode and low power mode, but only 100 mW in a smart low power mode. In a digital block of the DP Rx, 200 mW is consumed normal mode and a low power mode as well. However, in a smart low power mode the digital block may consume no power. By operating in a smart low power mode, power consumption may be reduced in an equalizer, PLL, crystal oscillator, and CDR unit.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, and/or use of equivalent functional junctions for couplings/links described herein.

What is claimed is:

1. A method for reducing power consumption in an information handling system (IHS), the method comprising:
   receiving data through a main channel of a video signal link, wherein the main channel provides at least one data lane and a standard link speed;
   receiving a reference clock through an auxiliary channel of the link; and
   providing the reference clock to a first phase-lock loop, wherein the first phase-lock loop outputs a stream clock that is selectively used to reduce the standard link speed.

2. The method of claim 1, wherein the link speed is selected for reducing power consumption in the IHS.

3. The method of claim 1, wherein the link speed is selected for reducing receiving power consumption to less than 450 mW.

4. The method of claim 1, wherein the video signal link is a DisplayPort link having a standard DisplayPort link rate.

5. The method of claim 4, wherein the link speed is selected to be less than the standard DisplayPort link rate.

6. The method of claim 4, wherein the reference clock has a clock rate different from the standard DisplayPort link rate.

7. The method of claim 1, wherein the main data is transmitted through the main link at various video signal resolution settings.

8. The method of claim 7, wherein the IHS may dynamically switch to a lower link speed at reduced video signal resolution settings.

9. An apparatus for reducing power consumption in an information handling system (IHS) comprising:
   a video signal link receiver comprising:
      a main link receiving main data, wherein the main link provides at least one data lane operating at a standard link speed;
      an auxiliary channel receiving a reference clock; and
   a first phase-lock loop, wherein the reference clock is provided to the first phase-lock loop, and the first phase-lock loop outputs a stream clock that is selectively used to reduce the standard link speed.

10. The apparatus of claim 9, wherein the link speed is selected for reducing power consumption in the IHS.

11. The apparatus of claim 9, wherein the link speed is selected for reducing the video signal link receiver power consumption to less than 450 mW.

12. The apparatus of claim 9, wherein the video signal link is a DisplayPort link having a standard DisplayPort link rate.

13. The apparatus of claim 12, wherein the link speed is selected to be less than the standard DisplayPort link rate.

14. The apparatus of claim 9 further comprising:

a transmitter, wherein the main data is transmitted through the main link at various video signal resolution settings.

15. The apparatus of claim 14, wherein the IHS may dynamically switch to a lower link speed at reduced video signal resolution settings.

16. An information handling system (IHS) including a DisplayPort video link, comprising:

a DisplayPort video signal transmitter including:

a main output transmitting main data at a given first clock rate, the given first clock rate determining a standard DisplayPort link speed; and an auxiliary output transmitting a reference clock at a second clock rate different than the first clock rate, and a DisplayPort video signal receiver including:

a main input receiving main data, wherein the main input provides at least one data lane;

an auxiliary input receiving the reference second clock; and a first phase-lock loop, wherein the reference second clock is provided to the first phase-lock loop, and the first phase-lock loop outputs a stream clock to selectively control the DisplayPort link speed.

17. The system of claim 16, wherein the DisplayPort link speed is selected for reducing power consumption in the IHS.

18. The system of claim 16, wherein the DisplayPort link speed is selected so that the DisplayPort receiver consumes less than 450 mW.

19. The system of claim 16, wherein the DisplayPort link speed is selected to be less than the standard DisplayPort link speed.

20. The system of claim 16, wherein the IHS may dynamically switch between the different link speeds.

* * * * *